United States Patent
Lachman et al.

(10) Patent No.: US 6,301,140 B1
(45) Date of Patent: Oct. 9, 2001

(54) CONTENT ADDRESSABLE MEMORY CELL WITH A BOOTSTRAP IMPROVED COMPARE

(75) Inventors: Jonathan E. Lachman, Fort Collins; J. Michael Hill, Ft. Collins; Todd W. Mellinger, Fort Collins, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/697,746

(22) Filed: Oct. 25, 2000

(51) Int. Cl.[7] .................................................. G11C 15/00
(52) U.S. Cl. ......................................... 365/49; 365/189.07
(58) Field of Search ................................. 365/49, 189.06, 365/189.07, 203, 190

(56) References Cited

U.S. PATENT DOCUMENTS

| | | | |
|---|---|---|---|
| 4,833,643 | * 5/1989 | Hori | 365/49 |
| 5,111,427 | * 5/1992 | Kobayashi et al. | 365/49 |
| 5,453,948 | * 9/1995 | Yoneda | 365/49 |
| 6,181,591 | * 1/2001 | Miyatake et al. | 365/49 |

* cited by examiner

*Primary Examiner*—Son Mai
(74) *Attorney, Agent, or Firm*—John Pessetto

(57) ABSTRACT

A content addressable memory, CAM, cell wherein the only compare-transfer FETS used are NFETs. The gates of the NFET compare-transfer FETS are driven to a voltage above the positive power supply, VDD. By precharging the bitlines to the negative power supply voltage, GND, the gate of one of the compare-transfer NFETS is driven above VDD when a bitline transitions from a "low" value to a "high" value. The capacitance between the bitline being driven high and the gate of a compare-transfer NFET couples the gate higher than VDD. This bootstrapping technique improves the compare access time of a CAM. In addition, this technique reduces the capacitance on the bitlines resulting in faster read and write access times and reduces the physical size of the CAM.

4 Claims, 1 Drawing Sheet

CONTENT ADDRESSABLE MEMORY CELL WITH A BOOTSTRAP IMPROVED COMPARE

FIELD OF THE INVENTION

This invention relates generally to electronic circuits. More particularly, this invention relates to integrated electronic circuits having content addressable memory, CAM.

BACKGROUND OF THE INVENTION

Content addressable memories, CAMs, are used in a variety of applications, such as sorting large databases, image recognition, and to index addresses on microprocessor chips. In a CAM, a multi-bit boolean data word is broadcast to an associative array. The associative array compares the incoming data word to each of the data words stored in the rows of the array. When the bits of the input match the bits of a word stored in any row of the associative array, it is called a match. When a match occurs, a signal is generated that is used to address a secondary array.

A CAM may be used in a microprocessor to create a look-up table that relates local or cache memory data to some hierarchical location in a microprocessor's main memory. In a simple form, if data has been transferred from main memory to a local cache memory, then the central processing unit, CPU needs to know that the data is stored locally. To make this determination, at least part of the address of the data from main memory is compared in the content addressable memory. If there is a match, or "hit", that data, plus the address that is generated from the CAM's secondary array, is used to inform the CPU where to find the data.

Integrated circuits such as dynamic random access memory, DRAMs, static random access memory, SRAMs, and microprocessors may include thousands of electronic circuits which may result in millions of transitions being placed on a chip. The cost of an individual chip can be reduced if the circuits comprising the chip are educed in size. Therefore, it is desirable to reduce the size of the circuits included on any VLSI chip. The physical size of a microprocessor may be dominated by the memory portion of the chip. Thus, it is desirable that the individual cells that make up a memory circuit be as small as possible.

SUMMARY OF THE INVENTION

In a preferred embodiment, the invention provides a content addressable memory cell using bootstrapping techniques to increase voltage on gates of transfer n-channel field effect transistors, (NFETs) connected bet nodes. A CAM cell embodying the invention, may be applied to reduce the physical size of an integrated circuit, reduce the read access time of the CAM, reduce the write access time of a CAM, and reduce the compare access time of a CAM. The invention may be easily adapted to many technologies used to fabricate integrated circuits.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENT

Figure 1:
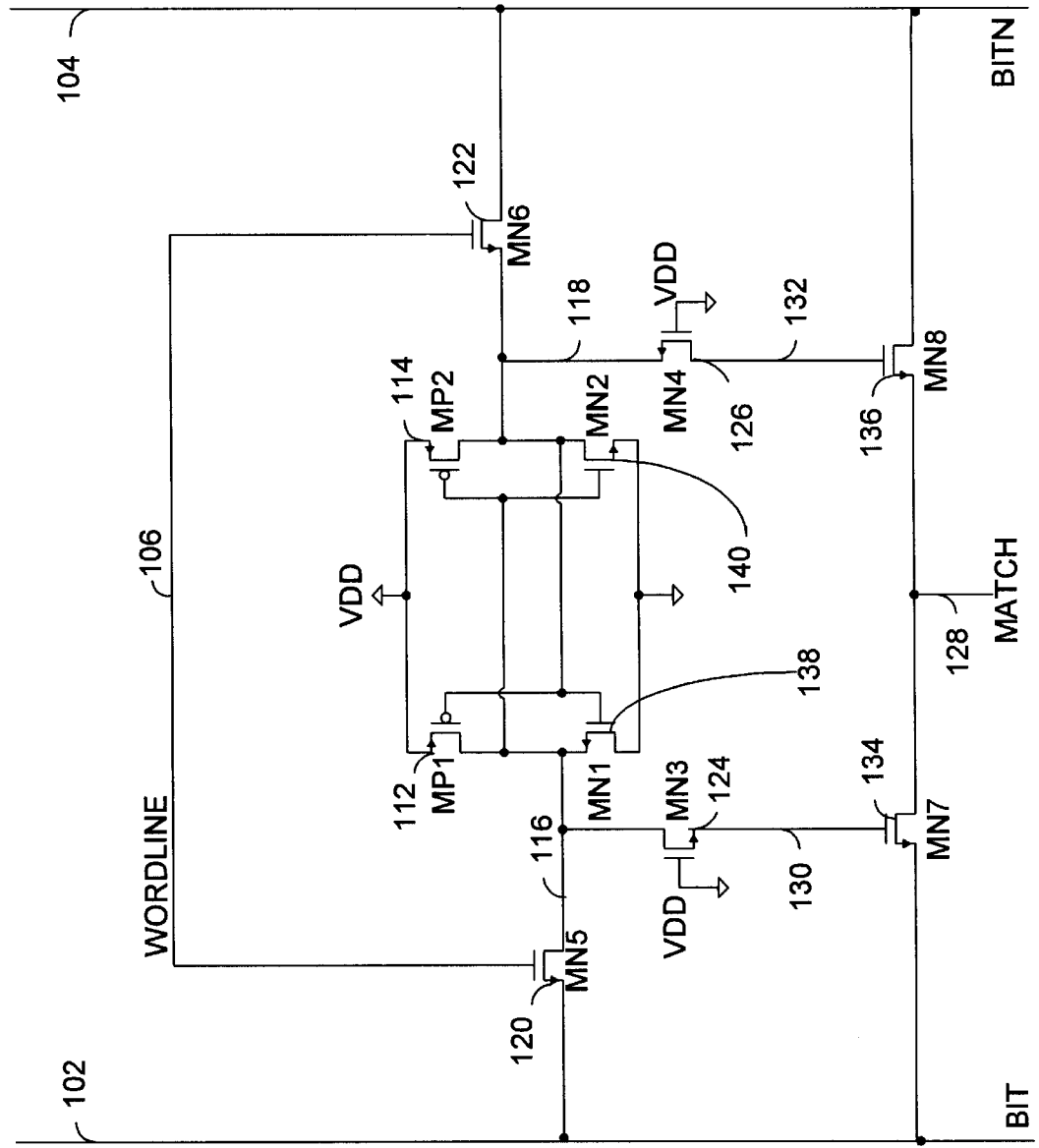
FIG. 1 is a schematic drawing of a bootstrapped content addressable memory cell.

FIG. 1 is a schematic diagram of a CAM. The sources of P-channel field effect transistors (PFETs) MP1 112 and MP2 114 are connected to the positive supply rail, VDD. The drain of MP1 112, the drain of MNI 138, a N-channel field effect transistor (NFET), the drain of MN5 120, and the drain of MN3 124 are connected to node 116. The gates of MP2 114 and MN2 140 are also connected to node 116. The drains of MP2 114, MN2 140, MN6 122, and MN4 126 are connected to node 118. The gates of MP1 112 and MN1 138 are also connected to node 118. The sources of MN1 138 and MN2 140 are connected to the negative supply rail, GND. A transfer NFET, MN5 120, has its source connected to the bitline, BIT 102. The gate of MN5 120 is connected to the wordline, WORDLINE 106. A transfer NFET, MN6 122 has its source connected to the bitline, BITN 104. The gate of MN6, 122 is connected to the wordline, WORDLINE 106. The gates of MN3 124, and MN4 126 are connected to the positive supply rail VDD. The gate of compare-transfer NFET MN7 134 is connected to the source of MN3 124, at node 130. In a like manner, the gate of compare-transfer NFET MN8 136 is connected to the source of MN4 126 at node 132. The drains of MN7 134 and MN8 136 are connected to the node MATCH 128.

The source of MN7 134 is connected to BIT 102 and the source of MN8 136 is BITN 104.

To illustrate the operation of the CAM cell as shown in FIG. 1, assume that the CAM memory element has been previously written to a logical high value, "1". This infers that node 116 is charged to the positive supply rail VDD and node 118 is charged to the negative supply rail GND. These two voltages are maintained on each of the nodes indefinitely as long as the WORDLINE 106 is held at a logical low value, zero. In this state, the bitlines, BIT 102, and BITN 104 can change voltages and it will not disturb the voltages on the memory nodes 116 and 118. With node 116 held at VDD, node 130 charges to VDD minus a threshold voltage, $V_T$. With node 118 held at GND, node 132 charge to GND. Because the voltage on the gate of MN8 136 is "low", no charge will be transferred from BITN, 104 to the MATCH line, 128. Since the gate 134 is charged to a "high" value, VDD minus a $V_T$, charge may be transferred from BIT 102 to MATCH 128 or from MATCH 128 to BIT 102 depending on the value of BIT 102. If BIT 102 is a logical high, a high will be transferred to the node, MATCH 128 and a "match" will have occurred, meaning the compare is valid. If BIT 102 is a logical low, a low will be transferred to the node, MATCH 128 and a "match" will not have occurred, meaning the contents of the CAM cell did not match the data on BIT 102 and BITN 104. The voltage on node 130 or node 132 can be greater than VDD minus a $V_T$ depending on how the bitlines, BIT 102 and BITN 104 are precharged before they are driven with data for the compare with the CAM cell. How node 130 or 132 can be charged higher than VDD is explained hereinafter.

Again, assume that node 116 has been previously written to a high, VDD and node 118 to GND and WORDLINE, 106 is now low. Since node 116 is VDD, node 130 will charge to (VDD-$V_T$) and in a similar manner node 118 will charge node 132 to GND. After writing the CAM cell values, both the bitlines BIT 102 and BITN 104 are precharged to a logical low value, GND. This establishes a voltage of (VDD-$V_T$) on the capacitor intrinsic to NFET MN7, 134 between the gate, 130 and the source 102. When a compare occurs, the bitlines BIT 102 and BITN, are driven differentially. In this particular case, because the CAM was written with a 1 on node 116, a MATCH will occur, that is drive MATCH 128 high, when BIT 102 is driven to VDD. The transition of BIT 102 being driven from GND to VDD causes the node 130 to capacitively couple to a voltage above VDD. Since node 130 is now higher in voltage than VDD it can transfer a voltage of VDD to the node MATCH, 128. Without the capacitive coupling, the MATCH value would reach no more than (VDD-$V_T$). The voltage on node 130 is isolated from node 116 by NFET MN3 because the gate of NFET MN3 is tied to the supply, VDD. How high node 130 is driven above VDD is dependent on the gate-to-source capacitance of MN7 134 and the capacitance of node 130 as well as the rate of change of the transition from GND to VDD on BIT 102. Because the gate 130 of MN7 134 is driven above a voltage of VDD, the MATCH node 128 can be driven faster than if node 130 were at a voltage of (VDD-$V_T$). This bootstrapping technique avoids the use of PFET transfer gates to achieve a full VDD voltage on the MATCH node 128 which improves the read, write and compare times of a CAM using bootstrapping techniques. This bootstrapping technique may also be used to reduce the physical size of a CAM.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A CAM cell comprising:
    NFET compare-transfer transistors between each bitline and a compare node wherein the voltage on the gates of said NFET compare-transfer transistors are bootstrapped above the positive supply voltage, VDD.

2. A CAM wherein the CAM cell in claim 1 is used as a memory cell.

3. A method for decreasing the compare time of a CAM cell integrated circuit comprising:
    a) fabricating a compare-transfer gate between a bit line and a compare line with a NFET MOS transistor only, having a first gate, a first source, and a first drain;
    b) isolating the gate of said NFET MOS transistor by inserting a second NFET MOS transistor having a second gate, a second source, and a second drain wherein said source of the second NFET MOS transistor is connected to the gate of said first NFET MOS transistor and said second gate is connected to VDD and said second drain is connected to a node of a differential memory element in a CAM cell;
    c) fabricating a compare-transfer gate between a bit line complement and the compare line with a third NFET MOS transistor only, having a third gate, a third source, and a third drain;
    d) isolating the gate of said third NFET MOS transistor by inserting a fourth NFET MOS transistor having a fourth gate, a fourth source, and a fourth drain wherein source of the fourth NFET MOS transistor is connected to the gate of said third NFET MOS transistor and said fourth gate is connected to VDD and said fourth drain is connected to the other node of the differential memory element in said CAM cell.

4. A method for decreasing the compare time of a CAM cell integrated circuit comprising:
    a) a compare-transfer gate between a bit line and a compare line with a NFET MOS transistor only, having a first gate, a first source, and a first drain wherein the gate of said NFET MOS transistor is isolated by inserting a second NFET MOS transistor having a second gate, a second source, and a second drain wherein said source of the second NFET MOS transistor is connected to the gate of said first NFET MOS transistor and said second gate is connected to VDD and said second drain is connected to a node of differential memory element in a CAM cell;
    b) a compare-transfer gate between a bit line complement and the compare line with a third NFET MOS transistor only, having a third gate, a third source, and a third drain wherein the gate of said third NFET MOS transistor is isolated by inserting a fourth NFET MOS transistor having a fourth gate, a fourth source, and a fourth drain wherein said source of the fourth NFET MOS transistor is connected to the gate of said third NFET MOS transistor and said fourth gate is connected to VDD and said fourth drain is connected to a node of a differential memory element in said CAM cell.

* * * * *

UNITED STATES PATENT AND TRADEMARK OFFICE
CERTIFICATE OF CORRECTION

PATENT NO. : 6,301,140 B1 Page 1 of 1
DATED : October 9, 2001
INVENTOR(S) : Lachman et al.

It is certified that error appears in the above-identified patent and that said Letters Patent is hereby corrected as shown below:

Column 1,
Line 38, delete "educed" and insert therefor -- reduced --
Line 48, delete "bet" and insert therefor -- between bitlines and compare --

Column 2,
Line 21, after "MATCH 128." do not begin a new paragraph

Signed and Sealed this

Twenty-fifth Day of November, 2003

JAMES E. ROGAN
*Director of the United States Patent and Trademark Office*